United States Patent
Altukoff et al.

(10) Patent No.: US 6,570,663 B1
(45) Date of Patent: May 27, 2003

(54) CALIBRATION METHOD AND DEVICE FOR VISUAL MEASURING SYSTEMS

(75) Inventors: Leo N. Altukoff, Battle Ground, WA (US); Mike W. Mayer, Woodland, WA (US); Barton V. White, Oregon City, OR (US)

(73) Assignee: Seh America, Inc., Vancouver, WA (US)

( * ) Notice: Subject to any disclaimer, the term of this patent is extended or adjusted under 35 U.S.C. 154(b) by 285 days.

(21) Appl. No.: 09/612,307

(22) Filed: Jul. 7, 2000

(51) Int. Cl.⁷ .............................................. G01B 11/08
(52) U.S. Cl. ..................... 356/635; 356/243.1
(58) Field of Search ............................... 356/635, 243.1

(56) References Cited

U.S. PATENT DOCUMENTS

| | | |
|---|---|---|
| 5,406,905 A | 4/1995 | Yemane-Berhane et al. |
| 5,437,242 A | 8/1995 | Hofstetter et al. |
| 5,653,799 A | 8/1997 | Fuerhoff |
| 5,656,078 A | 8/1997 | Fuerhoff |
| 5,660,629 A | 8/1997 | Shiraishi et al. |
| 5,665,159 A | 9/1997 | Fuerhoff |
| 5,846,318 A | 12/1998 | Javidi |
| 5,882,402 A * | 3/1999 | Fuerhoff ..................... 117/201 |
| 5,911,825 A | 6/1999 | Groat et al. |
| 5,961,716 A * | 10/1999 | White et al. .................. 117/14 |
| 5,976,245 A | 11/1999 | Aydelott |
| 6,030,451 A | 2/2000 | LaBrie et al. |
| 6,341,173 B2 * | 1/2002 | Altekrüger et al. ......... 381/141 |

* cited by examiner

*Primary Examiner*—Richard A. Rosenberger
(74) *Attorney, Agent, or Firm*—Oliff & Berridge, PLC

(57) ABSTRACT

A calibration method and a calibration device for two-point cold calibration are suitable for calibration of any visual measuring system having a width analyzer. In particular, the method and the calibration device are used to calibrate a CCD camera in a visual measuring system used to monitor the diameter of a crystal rod being grown by a crystal growing apparatus using the well-known Czochralski process. The calibration method takes into account non-linear error and avoids the need to actually grow crystals for calibration. The calibration device is specifically designed for quick and accurate set-up.

17 Claims, 4 Drawing Sheets

CALIBRATION METHOD AND DEVICE FOR VISUAL MEASURING SYSTEMS

BACKGROUND OF THE INVENTION

1. Field of Invention

This invention relates to calibration of visual measuring systems using a two-point cold calibration technique. More specifically, this invention relates to calibration of CCD cameras in a crystal growing apparatus and a calibration device for such an apparatus.

2. Description of Related Art

A substantial majority of monocrystalline silicon used to make silicon wafers for the microelectronics industry is produced by crystal growing apparatus using the well-known Czochralski process. The Czochralski process basically involves melting high-purity polycrystalline silicon in a quartz crucible in a specially designed furnace to form a silicon melt. A small seed crystal is suspended above the silicon melt on a pull wire or the like, which is arranged to be raised and lowered in a generally vertical direction. The seed crystal is lowered into contact with the silicon melt. The seed crystal is then raised slowly from the silicon melt so that a silicon crystal rod is grown by drawing silicon from the silicon melt. Examples of Czochralski crystal growing systems are described in U.S. Pat. Nos. 5,406,905; 5,911,825; and 5,976,245, each of which is incorporated herein by reference in its entirety.

Various control parameters, such as melt temperature, melt level and rate of crystal pulling, are known to affect the shape and size of the crystal rod being grown. Accordingly, the various parameters must be monitored and controlled to achieve a desired monosilicon crystal. Variations in the diameter of the crystal rod may result in excessive waste because the crystal rod must be trimmed and cut to produce silicon crystal wafer slices of uniform physical dimensions. Typically, the crystal rod is subjected to a grinding process to remove the outer peripheral surface until a predetermined diameter is obtained. Because of purity concerns, the material ground from the crystal rod cannot be reused. Accordingly, any material ground from the crystal rod is waste, resulting in undesirable increases in production cost when the diameter of the crystal rod is not accurately controlled during crystal growth.

It is known to monitor the diameter of a crystal during growth to achieve a desired crystal size. The various control parameters are monitored and adjusted to maintain the desired diameter during crystal growth. It is known to accurately measure the diameter of a growing crystal using CCD camera technology. For example, U.S. Pat. Nos. 5,437,242; 5,653,799; 5,660,629; 5,656,078; 5,665,159; 5,846,318; 5,961,716; and 6,030,451, each of which is incorporated herein by reference in its entirety, disclose various methods and apparatus for controlling the Czochralski process using one or more CCD cameras. Visual measuring systems employing other types of width analyzing apparatus are known and used, such as optical pyrometers, photocells, rotating mirrors with photocells, light sources with photocells, line-scan cameras, and two-dimensional array cameras.

Such visual measuring systems must be calibrated. Typically, calibration is performed by an operator and must rely on the skill of the operator. A known cold calibration technique for crystal growing apparatus involves growing several crystals of various diameters and recording data. Then, using the data and a two-point calibration formula, a two-point calibration is performed for the system. Such two-point calibration is used whenever a crystal growing apparatus is used to grow crystal rods with different diameters.

SUMMARY OF THE INVENTION

The invention is based upon the realization that the current two-point cold calibration technique is unsatisfactory because it does not take into account non-linear error. Further, it would be desirable to be able to calibrate the visual measuring system of a crystal growing apparatus without the use of expensive, high-purity silicon. In other words, it would be desirable to achieve calibration without actually growing crystal rods during the calibration process.

One aspect of this invention provides a calibration method for a visual measuring system that takes into account non-linear error. Another aspect of this invention achieves calibration of a visual measuring system of a crystal growing apparatus without the use of expensive, high-purity silicon in the calibration process. This invention provides improved diameter control for a crystal growing apparatus using a visual measuring system.

The calibration method according one aspect of this invention involves calculating an offset for the visual measuring system. The offset O is calculated using the following formula:

$$O = Z \cdot k / G,$$

where Z is a zero error value, k is an internal constant of the width analyzer of the visual measuring system, and G is the gain of the visual measuring system. The zero error value Z is calculated from data using the following formula:

$$Z = C - A / ((A-a)/(C-c))$$

where C is a first linear distance measured by the visual measuring system, A is the actual linear distance corresponding to C, c is a second linear distance measured by the visual measuring system, and a is the actual linear distance corresponding to c.

In one exemplary embodiment of the calibration method according to this aspect of the invention, a reference point is selected relative to a measurement standard. The gain of the measurement system is set so that an output signal is equal to a predetermined value while measuring a first point at a first linear distance from the reference point. The first linear distance of the first point is measured by the visual measurement system. A second point at a second linear distance from the reference point, less than the first linear distance, is measured by the visual measurement system. The actual values of the first and second linear distances are determined by reading the measurement standard. In the zero error formula above, the measured first linear distance of the first point is C, the actual first linear distance of the first point is A, the measured second linear distance of the second point is c and the actual second linear distance of the second point is a. The zero error Z is thus calculated and used in the offset formula above along with the value of the gain G and the internal constant k of the width analyzer of the visual measuring system to obtain the offset O.

Another aspect of this invention provides a calibration device which is used to carry out a calibration method in an apparatus using a visual measuring system including a width analyzer. The calibration device according to this aspect of the invention comprises a measurement standard that is mountable in a self-aligning manner within the apparatus. In particular, the measurement standard may be attached to a vertical support member that is mountable in a self-aligning manner within the apparatus.

According to various exemplary embodiments, the measurement standard may be a ruler and may be arranged to extend in a direction orthogonal to the vertical support member. Further, the measurement standard may be attached to the vertical support member by a countersunk screw which is centered at a zero position on the measurement standard.

According to various exemplary embodiments, the vertical support member may comprise a pedestal plug having a relatively wide proximal end and a relatively narrow distal end. The pedestal plug preferably is made of graphite and may have a tapered section disposed between the proximal end and the distal end.

The vertical support member may further comprise a vertical spacer extending between the pedestal plug and the measurement standard such that the measurement standard is suspended at a predetermined distance above the pedestal plug. Preferably, the vertical spacer is narrower than the distal end of the pedestal plug.

These and other features and advantages of this invention are described in or are apparent from the following detailed description of various exemplary embodiments of the calibration method and device according to this invention.

BRIEF DESCRIPTION OF THE DRAWINGS

The invention will be described in relation to the following drawings in which like reference numerals refer to like elements, and wherein:

FIG. 2b is a perspective view of the calibration device of FIG. 2a;

DETAILED DESCRIPTION OF PREFERRED EMBODIMENTS

While the calibration method according to this invention is suitable for calibrating various types of visual measuring systems having a width analyzer, it is particularly advantageous for calibrating a visual measuring system of a crystal growing apparatus. As noted above, accurate measurement of the diameter of a crystal rod being grown is very important to avoid excessive waste of semiconductor material. The calibration method of this invention takes linear error into account so that measurement accuracy is improved. In particular, measurement accuracy is improved within an operative measurement range for the visual measuring system.

Particular features of the calibration device simplify calibration of the visual measuring system. While it may be used in other apparatus as well, the calibration device is particularly adapted for use with a crystal growing apparatus.

Therefore, exemplary embodiments of the calibration method and the calibration device according to this invention are described herein with reference to a typical crystal growing apparatus. This invention, however, is not to be considered to be limited by the description of the crystal growing apparatus or its use therewith.

Figure 1:
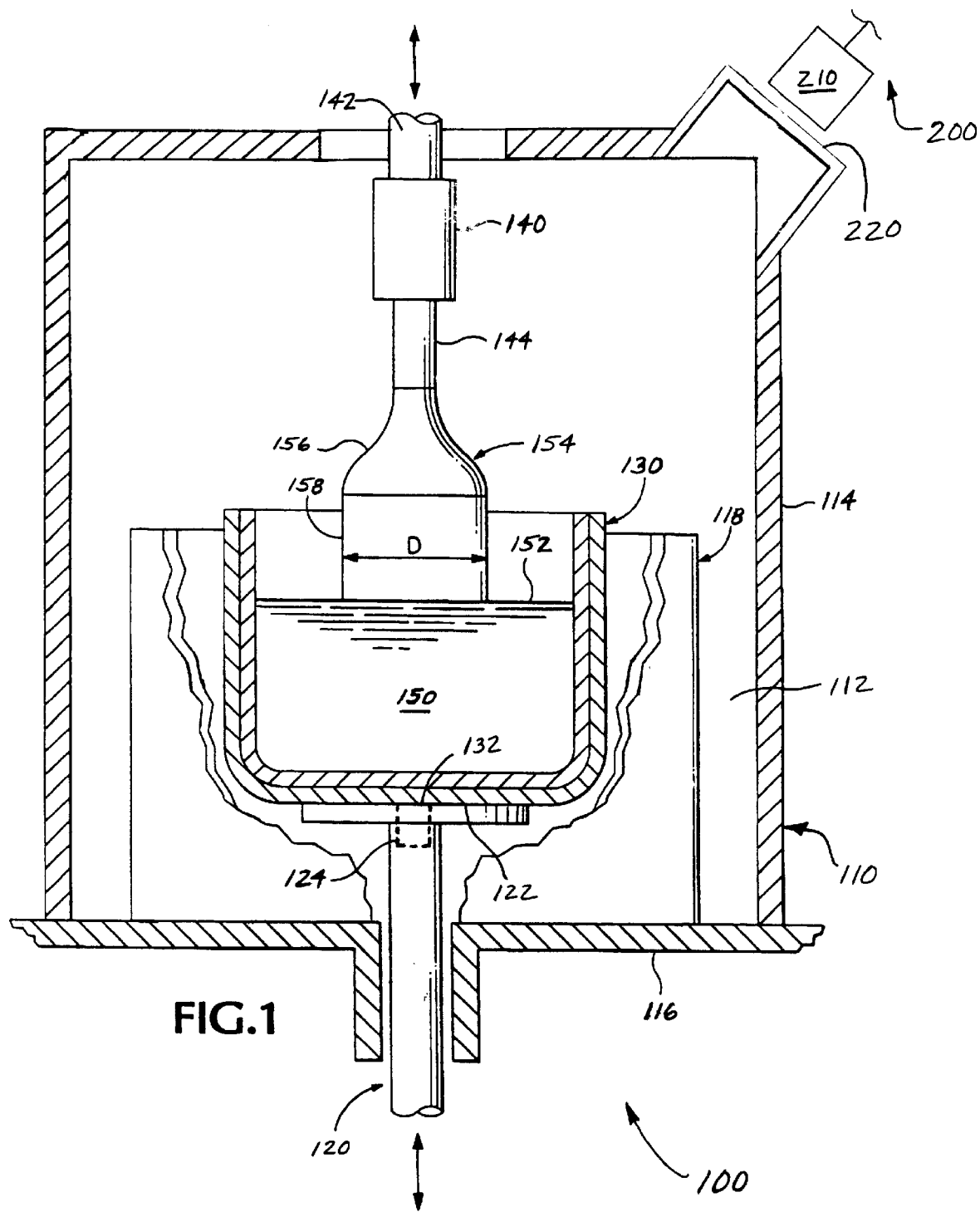
FIG. 1 is a schematic view of a crystal growing apparatus having a visual measuring system that is to be calibrated according to this invention.

FIG. 1 illustrates a typical crystal growing apparatus 100 for carrying out the well-known Czochralski process. The crystal growing apparatus 100 comprises a specially designed furnace 110 having a heat chamber 112 formed by an insulating structure 114 supported on a platform 116. A heater 118 is provided within the heat chamber 112.

A shaft 120 extends vertically through an opening in the platform 116. The shaft 120 may be provided with a support surface 122 which may include a central recess 24. If the shaft 120 is not provided with the support surface 122, then the central recess 24 may be formed directly in the uppermost end of the shaft 120. The shaft 120 is designed to be rotatable around its axis as well as vertically movable along its axis for reasons described in the above-mentioned references.

Further, the shaft 120, with or without the support surface 122, is adapted to receive a quartz-lined crucible 130. The crucible 130 has a base protrusion 132 which extends downwardly and cooperates with the central recess 24 to mount the crucible 130 on the shaft 120 in proper alignment. Thus, the crucible 130 may be easily removed and replaced.

A graphite chuck 140 is suspended above the crucible 130 by a holder 142. The holder 142 may comprise a cable, wire or shaft that is movable so as to raise and lower the graphite chuck 140. The holder 142 extends vertically through an upper opening in the insulating structure 114 and is generally aligned with the shaft 120 so that the graphite chuck 140 is generally centered over the crucible 130. The graphite chuck 140 is adapted to hold a seed crystal 144.

A quantity of semiconductor material 150, typically silicon, is placed in the crucible 130 and heated by the heater 118 into a molten state. In the molten state, the quantity of semiconductor material 150 defines a melt surface 152 which is the melt level. The graphite chuck 140 is lowered by the holder 142 until the seed crystal 144 contacts the melt surface 152 and is "dipped" into the molten semiconductor material 150.

By slowly withdrawing the seed crystal 144 from the molten semiconductor material 150, a crystal rod 154 is grown. Initially, the graphite chuck 140 is raised at a rate so that the crystal rod 154 is narrow enough to remove dislocations. The rate is then slowed so that a shoulder region 156 is formed until a desired diameter of the crystal rod 154 is reached and maintained to form a body portion 158.

The diameter of the growing crystal rod 154 is monitored throughout the process by a visual measuring system 200. The visual measuring system 200 includes a width analyzer for measuring the diameter of the growing crystal rod 154. In the exemplary embodiment shown in FIG. 1, the visual measuring system 200 includes a CCD camera 210 which is positioned to detect the diameter of the crystal rod 154 at the melt surface 152 through a view port 220 formed in the insulating structure 114 of the furnace 110. The visual measuring system 200 communicates with an automatic control system (e.g., a computer including a CPU) which controls the various crystal growing parameters to maintain the desired diameter of the crystal rod 154.

The visual measuring system 200 must be calibrated prior to growing a crystal rod so that accurate measurement and production of the desired diameter is ensured. In particular, the CCD camera 210 must be calibrated. As noted above, a known calibration technique involves collecting data by growing several crystal rods of different diameters and using the collected data to adjust the visual measuring system accordingly. This calibration technique, however, is time consuming and unnecessarily wastes valuable semiconductor material.

A single-point calibration technique may be used which does not require a user to actually grow a crystal rod to calibrate the visual measuring system. However, a single-point calibration technique does not take into account non-linear error, and calibration must be repeated each time a crystal rod with a different diameter is to be grown. On the other hand, the calibration method of the invention is a two-point cold calibration technique that avoids the need to actually grow a crystal rod to calibrate the visual measuring system, and also takes into account non-linear error. Thus, once calibrated by the calibration method of the invention, the crystal growing apparatus may be used to grow crystal rods with different diameters without re-calibration of the visual measuring system.

Figure 2A:
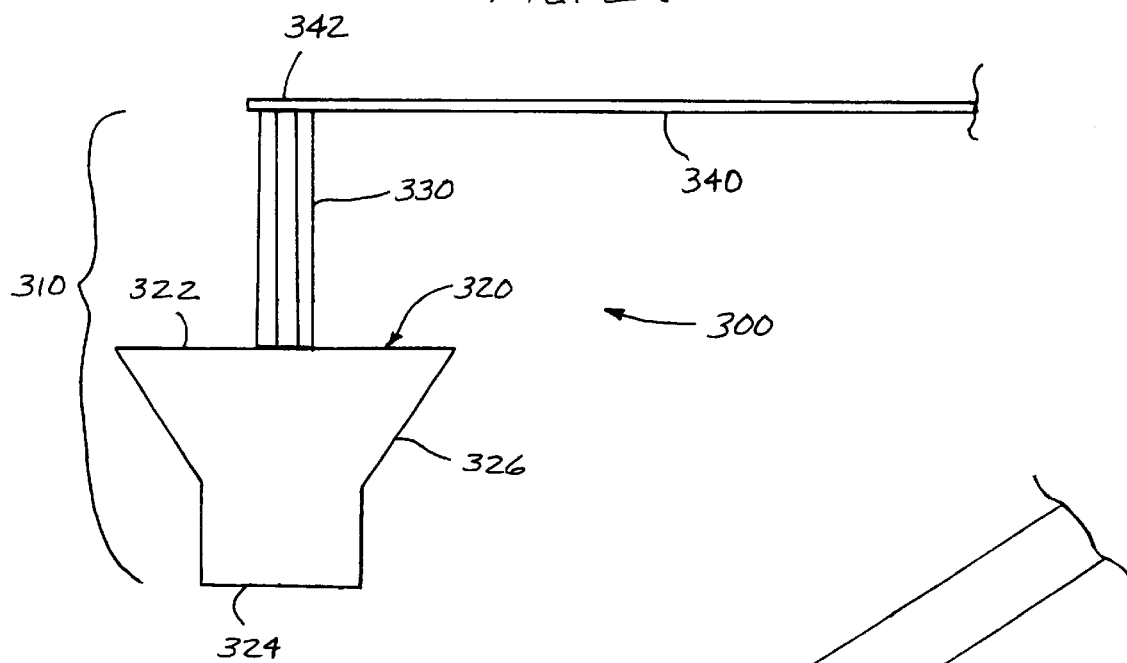
FIG. 2a is a plan view of an exemplary embodiment of a calibration device according to this invention.
Figure 2B:
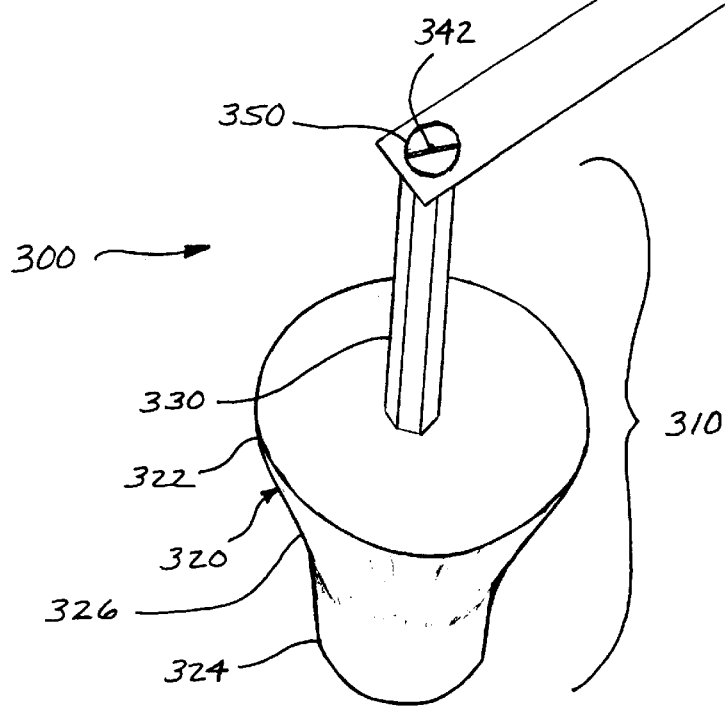

In addition to the novel calibration method, the invention provides a special calibration device for carrying out the calibration method. As shown in FIGS. 2a and 2b, an exemplary embodiment of a calibration device 300 according to the invention comprises a vertical support member 310 onto which a measurement standard 340 is mounted. The measurement standard 340 may be a ruler, for example of 100 mm, but also may be any other suitable structure which provides at least two points whose distances from a reference point may be determined. In the exemplary embodiment shown, the measurement standard 340 is arranged to extend in a direction orthogonal to the vertical support member 310.

According to the invention, the vertical support member 310 is designed to be mountable in a self-aligning or self-centering manner within the particular apparatus. In the crystal growing apparatus 100 illustrated in FIG. 1, for example, the vertical support member 310 should be mountable within the furnace 110 so that the measurement standard 340 of the calibration device 300 is automatically located in a proper position relative to the crystal growing apparatus 100 within the field of view of the CCD camera 210. The self-aligning feature of the calibration device 300 according to the invention provides fast and accurate set-up for calibration.

To this end, the vertical support member 310 of the calibration device 300 is preferably be formed as a graphite pedestal plug 320 and a vertical spacer 330. In the exemplary embodiment shown, the pedestal plug 320 has a relatively wide proximal end 322 and a relatively narrow distal end 324, with a tapered section 326 therebetween. The distal end 324 is adapted to fit into the central recess 124 of the shaft 120 upon removal of the crucible 130. The wider proximal end 322 prevents the pedestal plug 320 from being set too far into the central recess 124. In addition to centering the pedestal plug 320 within the central recess 124, the tapered section 326 may be used to provide a good fit with recesses of varying diameter so that the calibration device 300 may be used with multiple apparatus.

The calibration device 300 is electrically conductive so that a contact indicator (not shown) of the crystal growing apparatus 100 may be used to precisely locate the measurement standard 340 at the height corresponding to a height of the melt surface 152 during crystal growth.

The vertical spacer 330 is centrally connected to the plug pedestal 320. The measurement standard 340 is in turn attached to the vertical spacer 330. While any suitable attachment means is contemplated, in the exemplary embodiment shown, the measurement standard 340 is attached to the vertical spacer 330 by a countersunk screw 350. The countersunk screw 350 minimizes interference with optical measurement made by the visual measuring system 200 during calibration.

The vertical spacer 330 may be, for example, 150mm hex stock which is screwed into a hole drilled and tapped in the precise center of the pedestal plug 320. Also, a zero position 342 of the measurement standard 340 is exactly centered on the vertical spacer 330. The vertical spacer 330 separates the measurement standard 340 from the pedestal plug 320 so that the pedestal plug 320 does not interfere with the optical measurement made by the visual measurement system 200 during calibration. The vertical spacer 330 preferably is narrower than the pedestal plug 320 to minimize interference with optical measurement made by the visual measuring system 200 during calibration.

Figure 3:
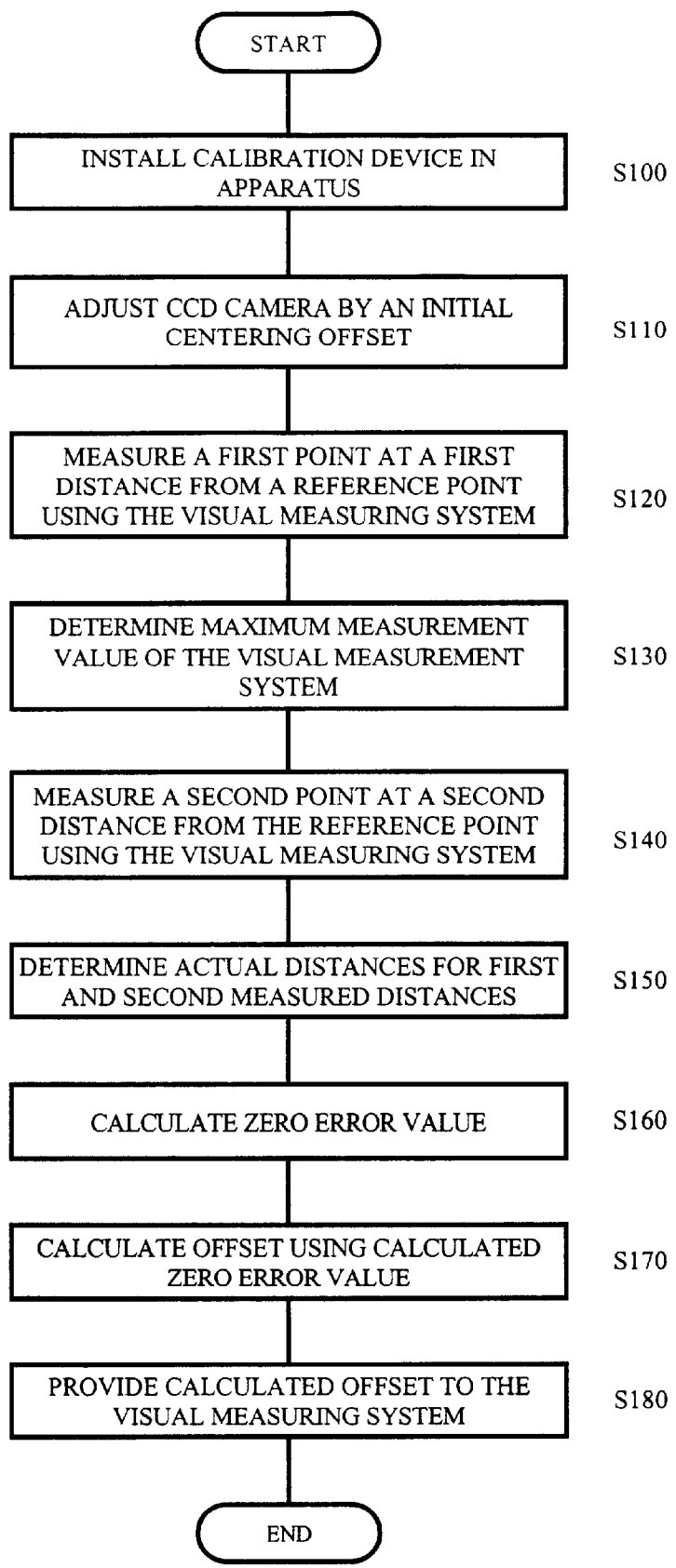
FIG. 3 is a flowchart outlining an exemplary embodiment of a calibration method according to this invention.

As outlined in the flowchart of FIG. 3, according to an exemplary embodiment of the calibration method of the invention, the calibration device 300 is first mounted in the crystal growing apparatus 100, as described above (step S100). The height of the calibration device 300 is adjusted to position the measurement standard 340 at the height corresponding to a height of the melt surface 152 during crystal growth. The contact indicator (not shown) of the crystal growing apparatus 100 is used to precisely locate the measurement standard 340 using the same process used to detect the actual melt level during crystal production. The graphite chuck 140 is lowered to a predetermined position (the position of a throat sensor). Then, the shaft 120 is raised until the measurement standard 340 contacts the graphite chuck 140.

Once the calibration device is properly installed, the CCD camera 210 is positioned so that the visual measuring system 200 is set up to measure from the center of the apparatus. This offsets the CCD camera 210 from its normal measuring position by an initial offset $O_i$ (step 110). The initial offset $O_i$ is provided to the visual measuring system 200.

The CCD camera 210 of the visual measuring system 200 is then used to measure a first point at a first linear distance A from a reference point (step S120). While measuring the first linear distance A using the CCD camera 210, a gain G of the visual measuring system 200 is adjusted to a obtain zero error between a first measured distance C of the first point and the first linear distance A. In other words, the gain G is adjusted until the first measured distance C is equal to the first linear distance A.

Once the gain G of the visual measuring system 200 has been adjusted, a maximum measurement value M is determined for the visual measuring system 200 (step S130). The maximum measurement value M is the largest value that can be measured by the visual measuring system 200 at a particular gain.

At the gain G, a second point at a second linear distance a from the reference point is then measured using the CCD camera 210 of the visual measuring system 200 (step S140). A second measured distance c is thus obtained.

The first linear distance A and the second linear distance a are determined by reading the actual distances from the measurement standard 340 (step S150). For example, the first linear distance A may be 80 mm (corresponding to a diameter measurement of 160 mm since the calibration is carried out with the CCD camera centered, offset from its normal measuring position) and the second linear distance a may be 65 mm (corresponding to a diameter measurement of 130 mm).

Using this data, in step S160, a zero error value Z is calculated using the formula:

$$Z = M - A/((A-a)/(M-c)).$$

Using the calculated zero error value Z, in step S170, an offset $O_c$ is calculated using the formula:

$$O_c = Z \cdot k/G,$$

where k is an internal constant of the width analyzer of the visual measuring system and G is the gain of the visual measuring system when measuring the first linear distance A. A typical value of k is 8726.00–8726.50.

The calculated offset $O_c$ is provided to the visual measuring system 200 so that the second measured distance c is "forced" by the visual measuring system 200 to be linear to the first measured distance C (step S180). In other words, the initial offset $O_i$ and the calculated offset $O_c$ are used by the visual measuring system 200 to adjust the second measured distance c to equal the second linear distance a. Adjustment by the visual measuring system 200 for measurements of other distances, e.g., between distances A and a, may then be achieved using linear interpolation.

Figure 4:
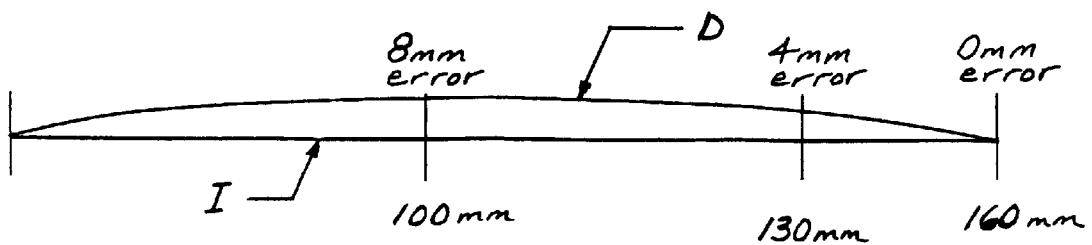
FIG. 4 is a graph of measurement deviation from ideal for a visual measuring system that has been calibrated using a one-point calibration technique.

FIG. 4 illustrates the non-linear error present when a single-point calibration method is used, wherein I is a line representing the ideal measurement in millimeters and D is a line representing the measured value deviation from the ideal in millimeters. Although the visual measuring system 200 has been calibrated, only crystal rod diameters of 160 mm can be measured by the system without any error. Thus, if a crystal rod diameter other than 160 mm is desired, the visual measuring system 200 must be re-calibrated for that diameter, or valuable semiconductor material will be wasted.

Figure 5:
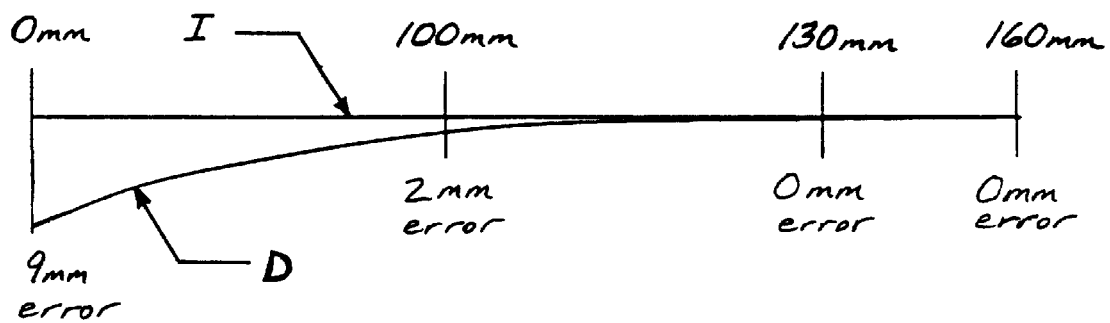
FIG. 5 is a graph similar to FIG. 4 for the visual measuring system that has been calibrated using a two-point calibration technique according to this invention.

FIG. 5 illustrates the error resulting from the two-point cold calibration method of the invention. As shown, 130 mm and 160 mm have been linearized with zero error. In the example of the crystal growing apparatus 100, crystal rod diameter is not measured by the visual measuring system 200 until it reaches a predetermined value, for example, 100 mm. Therefore, the error of the visual measuring system 200 when measuring a diameter of 100 mm is not as significant and the increased error below 100 mm is unimportant.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention. In particular, it should be understood that the distances described above are merely illustrative. In addition, while the various elements of the invention are shown in various combinations and configurations, including more, less, or only a single element, are also within the spirit and scope of the invention.

What is claimed is:

1. A calibration method for a visual measuring system, the method comprising:

measuring a first linear distance from a reference point using the visual measuring system;

selecting a gain of the visual measuring system such that readings of the visual measuring system are accurate when measuring the first linear distance from the reference point;

measuring a second linear distance from the reference point using the visual measuring system and the selected gain;

determining an offset for the visual measuring system that compensates readings of the visual measuring system so that readings of the visual measuring system using the selected gain are compensated to be accurate when measuring the second linear distance from the reference point; and using the determined offset to calibrate the visual measuring system.

2. The method of claim 1, wherein the second linear distance is less than the first linear distance.

3. The method of claim 1, further comprising selecting the reference point relative to a measurement standard.

4. The method of claim 3, further comprising installing a support member on an apparatus with which the visual measuring system is to be used, the measurement standard being attached to the support member.

5. The method of claim 4, wherein the support member is self-aligning such that installing the support member locates the measurement standard in a proper measuring position relative to the apparatus.

6. The method of claim 1, wherein the width analyzer is located in a crystal growing apparatus and is used to measure width of a crystal being grown by the crystal growing apparatus.

7. The method of claim 6, wherein the crystal being grown by the crystal growing apparatus is monocrystalline silicon.

8. The method of claim 6, wherein the crystal growing apparatus grows the crystal using the Czochralski process.

9. A calibration method for a visual measuring system having a width analyzer, the method comprising:

obtaining a measured value of an actual linear distance A of a first point from a reference point using the width analyzer;

setting a value of a gain of the visual measuring system to a value G such that the measured value is equal to the actual linear distance A;

obtaining a measured value c of an actual linear distance of a second point from the reference point using the width analyzer;

calculating a zero error value Z using the formula $$Z = M - A/((A-a)/(M-c))$$

where M is a maximum measurement value for the visual measuring system at the gain value G;

calculating an offset $O_c$ to be used when measuring objects having a length of approximately a, using the formula $$O_c = Z \cdot k/G,$$

where k is an internal constant of the width analyzer of the visual measuring system; and using the calculated offset $O_c$ to calibrate the visual measuring system.

10. The method of claim 9, wherein the actual linear distance a is less than the actual linear distance A.

11. The method of claim 9, further comprising determining the actual linear distance A and the actual linear distance a from the reference point by reading the actual distances a and A from a measurement standard.

12. The method of claim 9, further comprising selecting the reference point relative to a measurement standard.

13. The method of claim 12, further comprising installing a support member on an apparatus with which the visual measuring system is to be used, the measurement standard being attached to the support member.

14. The method of claim 13, wherein the support member is self-aligning such that installing the support member locates the measurement standard in a proper measuring position relative to the apparatus.

15. The method of claim 9, wherein the width analyzer is located in a crystal growing apparatus and is used to measure width of a crystal being grown by the crystal growing apparatus.

16. The method of claim 15, wherein the crystal being grown by the crystal growing apparatus is monocrystalline silicon.

17. The method of claim 15, wherein the crystal growing apparatus grows the crystal using the Czochralski process.

* * * * *